United States Patent [19]

Nakamura et al.

[11] Patent Number: 5,178,645
[45] Date of Patent: Jan. 12, 1993

[54] CUTTING TOOL OF POLYCRYSTALLINE DIAMOND AND METHOD OF MANUFACTURING THE SAME

[75] Inventors: Tsutomu Nakamura; Tetsuo Nakai, both of Hyogo, Japan

[73] Assignee: Sumitomo Electric Industries, Ltd., Osaka, Japan

[21] Appl. No.: 772,268

[22] Filed: Oct. 7, 1991

[30] Foreign Application Priority Data

Oct. 8, 1990 [JP] Japan .................. 2-271011
Nov. 27, 1990 [JP] Japan .................. 2-326277
Jan. 16, 1991 [JP] Japan .................. 3-003151

[51] Int. Cl.$^5$ .............................. B24D 3/00
[52] U.S. Cl. ........................ 51/293; 51/295; 51/307; 51/309
[58] Field of Search ............ 51/293, 295, 307, 309

[56] References Cited

U.S. PATENT DOCUMENTS

| | | | |
|---|---|---|---|
| 4,157,897 | 6/1979 | Keaf | 51/295 |
| 4,162,899 | 7/1979 | Molnar et al. | 51/309 |
| 4,690,691 | 9/1987 | Komanduri | 51/293 |
| 4,832,707 | 5/1989 | Kamohara et al. | 51/307 |
| 5,075,181 | 12/1991 | Quinto et al. | 51/307 |

Primary Examiner—Karl Group
Assistant Examiner—Willie J. Thompson
Attorney, Agent, or Firm—W. G. Fasse

[57] ABSTRACT

A polycrystalline diamond cutting tool is prepared by employing polycrystalline diamond which is synthesized on a mirror-finished surface of a base material by a low-pressure vapor phase method, as a tool material. A surface, which has been in contact with the base material, of the polycrystalline diamond layer is utilized as a tool rake face. A flank of the tool is formed by laser processing. The flank is covered with a graphite coating layer in one embodiment, while such a graphite coating layer is removed by acid treatment or the like in another embodiment. In still another embodiment, a flank is formed by grinding, and a cutting edge portion is honed by laser processing.

45 Claims, 4 Drawing Sheets

CUTTING TOOL OF POLYCRYSTALLINE DIAMOND AND METHOD OF MANUFACTURING THE SAME

BACKGROUND OF THE INVENTION

1. Field of the Invention

The present invention relates to a cutting tool of polycrystalline diamond having excellent edge sharpness, which is optimum for finishing a work piece of a nonferrous metal or a nonmetal, and a method of manufacturing the same.

2. Background Information

Diamond, which has high hardness as well as high heat conductivity, is applied to a cutting tool or a wear resisting tool. However, monocrystal diamond is disadvantageously cloven. In order to suppress such a disadvantage, there has been developed a diamond sintered body which is obtained by sintering diamond by a very high pressure sintering technique, as described in Japanese Patent Publication No. 52-12126 (1977).

As to commercially available diamond sintered bodies, it is known that particularly a fine-grained sintered body having a grain size of not more than several 10 $\mu m$ is not subject to cleavage as observed in the aforementioned monocrystal diamond, and exhibits excellent wear resistance.

However, since such a diamond sintered body contains several percent to several 10 percent of a binder, chipping is inevitably caused in units of the grains forming the same. Such a chipping phenomenon is remarkably increased as a wedge angle of the tool cutting edge is reduced, and hence it is extremely difficult to manufacture a tool having a sharp cutting edge. Although it is possible to grind the cutting edge with a fine-grain diamond grindstone of #3000 to #5000, for example, in order to suppress chipping of the cutting edge in a manufacturing process of the cutting tool, such chipping of the cutting edge cannot be suppressed to below 5 $\mu m$ even if this method is employed. In the method of grinding the cutting edge with a fine-grain diamond grindstone, a new problem is caused in that the working efficiency is reduced as the grain size of the grindstone becomes smaller.

In a known method of working a diamond sintered body, electrical discharge machining or laser beam machining is employed in place of the aforementioned grinding. In the existing circumstances, however, it is impossible to obtain a tool having excellent edge sharpness by such machining, since the diamond sintered body contains a binder.

The inventors have devised a cutting tool, which is prepared from a tool material of polycrystalline diamond containing no binder, i.e., polycrystalline diamond synthesized by a low-pressure vapor phase method, in place of a diamond sintered body. Japanese Patent Laying-Open Gazette No. 1-212767 (1989) discloses an exemplary cutting tool which is prepared from a material of such polycrystalline diamond.

However, in such a cutting tool of polycrystalline diamond, the cutting edge is chipped by about 5 $\mu m$ when the same is formed by grinding, and it is impossible to suppress such chipping.

SUMMARY OF THE INVENTION

An object of the present invention is to improve the edge sharpness of a polycrystalline diamond cutting tool.

Another object of the present invention is to reduce the amount of chipping in a cutting edge of a polycrystalline diamond cutting tool.

Still another object of the present invention is to suppress initial chipping of a polycrystalline diamond cutting tool.

A further object of the present invention is to provide a method of manufacturing a polycrystalline diamond cutting tool which has an excellent edge sharpness.

In a first aspect of the present invention, a polycrystalline diamond cutting tool is prepared from a tool material of polycrystalline diamond which is synthesized by a low-pressure vapor phase method. The tool material has a cutting edge flank which is covered with a graphite layer formed by laser processing and a rake face which has a surface finish of not more than 0.2 $\mu m$ in surface roughness at the maximum height of irregularities $R_{max}$. Another polycrystalline diamond cutting tool is prepared from a tool material of polycrystalline diamond which is synthesized by a low-pressure vapor phase method. The tool material is connected with a tool holder and has a cutting edge flank which is covered with a graphite layer formed by laser processing, as well as a rake face which is in a mirror of not more than 0.2 $\mu m$ in surface roughness at the maximum height of irregularities $R_{max}$.

In a second aspect of the present invention, a polycrystalline diamond cutting tool is prepared from a tool material of polycrystalline diamond which is synthesized by a low-pressure vapor phase method. The polycrystalline diamond cutting tool has a rake face of not more than 0.2 $\mu m$ in surface roughness at the maximum height of irregularities $R_{max}$ and a flank exposing a surface of polycrystalline diamond, and is so structured that the size of cutting edge chipping along the intersection between the rake face and the flank is at least 0.5 $\mu$, and not more than 5 $\mu m$. This polycrystalline diamond cutting tool also includes a structure of an edge-worked polycrystalline diamond tool material which is directly mounted on a cutting machine, or a structure of such a polycrystalline diamond tool material which is connected with a tool holder.

In a third aspect of the present invention, a polycrystalline diamond cutting tool is prepared from a tool material of polycrystalline diamond which is formed by a low-pressure vapor phase method. The tool material of polycrystalline diamond is provided with a rake face and a flank, while a cutting edge portion which is formed along the intersection between the rake face and the flank has a honed curved surface.

In a fourth aspect of the present invention, a polycrystalline diamond cutting tool is manufactured through the following steps: First, polycrystalline diamond is deposited on a surface of a base material of not more than 0.2 $\mu m$ in surface roughness at the maximum height of irregularities $R_{max}$ by a low-pressure vapor phase method. Then, the polycrystalline diamond, which is deposited on the base material, is cut into a prescribed tip configuration, and thereafter the base material is removed from the polycrystalline diamond tip. Then, a surface of the polycrystalline diamond, which intersects with another surface having been in contact with the base material, is subjected to laser beam processing, thereby forming a cutting edge flank.

In a polycrystalline diamond cutting tool of such a structure that a polycrystalline diamond tip is connected with a tool holder, the tip is so connected with the tool holder that a surface, having been in contact with the base material, of the polycrystalline diamond tip, from which the base material is removed, defines a rake face of the tool, and thereafter a cutting edge flank is formed by laser processing.

In a fifth aspect of the present invention, a polycrystalline diamond cutting tool is manufactured by the following steps:

First, polycrystalline diamond is deposited on a surface of a base material having surface roughness of not more than 0.2 μm at the maximum height of irregularities $R_{max}$ by a low-pressure vapor phase method. Then, the polycrystalline diamond, which is deposited on the base material, is cut into a prescribed tip configuration, and thereafter the base material is removed from the polycrystalline diamond tip. A surface of the polycrystalline diamond tip, which intersects with another surface having been in contact with the base material, is subjected to laser processing, to form a cutting edge flank. Thereafter a graphite coating layer which is formed on the cutting edge flank by the laser processing is removed.

In a polycrystalline diamond cutting tool of such a structure that a polycrystalline diamond tip is connected with a tool holder, the tip is so connected with the tool holder that a surface, having been in contact with the base material, of the polycrystalline diamond tip, from which the base material is removed, defines a rake face of the tool, and thereafter a cutting edge flank is formed by laser processing.

In a sixth aspect of the present invention, a polycrystalline diamond cutting tool is manufactured as follows: First, polycrystalline diamond is deposited on a surface of a base material by a low-pressure vapor phase method. Then, the polycrystalline diamond, which is deposited on the base material, is cut into a prescribed tip configuration, and thereafter the base material is removed from the polycrystalline diamond tip. A surface of the polycrystalline diamond, which has been in contact with the base material, is used to define a tool rake face, and a flank is formed at a prescribed angle with respect to the rake face, thereby forming a cutting edge portion. The cutting edge portion is then honed to form a curved surface.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 6:
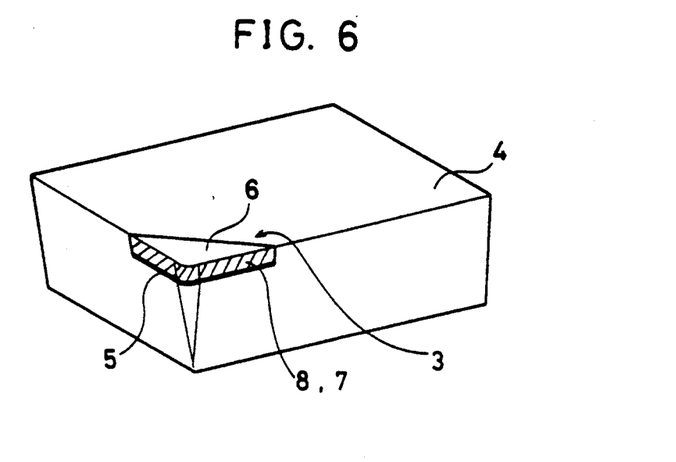
FIG. 6 is a structural diagram showing the polycrystalline diamond cutting tool according to the first embodiment of the present invention.

Referring to FIG. 6 showing a first embodiment of the present invention, a polycrystalline diamond tip 3 is strongly attached to a tool holder 4 of cemented carbide, steel or the like through a brazing portion 5. The upper surface of the polycrystalline diamond tip 3 forms a tool rake face 6, while a flank 7 is formed at a prescribed angle with respect to the rake face 6. A cutting edge portion is formed along the intersection between the cutting face 6 and the flank 7.

FIGS. 1 to 5 illustrate steps of manufacturing the polycrystalline diamond cutting tool shown in FIG. 6.

Figure 1:
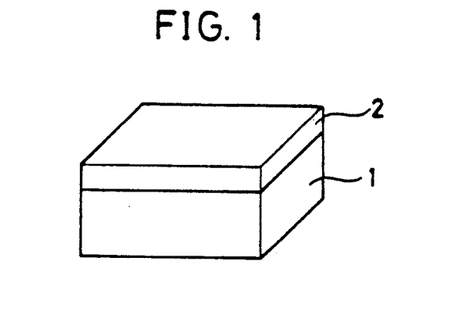
FIGS. 1 to 5 are process drawings showing steps of manufacturing a polycrystalline diamond cutting tool according to a first embodiment of the present invention.

Referring to FIG. 1, a polycrystalline diamond layer 2 is formed on a surface of a substrate 1 of a metal or an alloy by a low-pressure vapor phase method. The surface of the substrate 1 is mirror-finished with surface roughness of not more than 0.1 μm at the maximum height of irregularities $R_{max}$. Polycrystalline diamond is deposited on this surface by a low-pressure vapor phase method of decomposing and exciting raw material gas through thermoionic emission or plasma discharge, or a film forming method employing combustion flame. The raw material gas is generally prepared from mixed gas which is mainly composed of an organic carbon compound of hydrocarbon such as methane, ethane or propane, alcohol such as methanol or ethanol, ester etc. and hydrogen. In addition, the raw material gas may further contain inert gas such as argon, carbon dioxide, water etc. in a range exerting no influence on synthesis of diamond and its characteristics. The polycrystalline diamond is synthesized on the surface of the substrate 1 by such a low-pressure vapor phase method so that its mean crystal grain size is 0.5 to 15 μm. The crystal grain size of the polycrystalline diamond is defined in the above range since wear resistance of the cutting tool is reduced if the mean crystal grain size is smaller than 0.5 μm, while the cutting tool is easily chipped if the mean crystal grain size exceeds 15 μm. In order to reduce internal stress of the polycrystalline diamond, the substrate 1 is preferably prepared from a material such as molybdenum (Mo), tungsten (W), silicon (Si) or the like, whose coefficient of thermal expansion is close to that of diamond. In this specification and claims, silicon is treated as metal.

Figure 2:
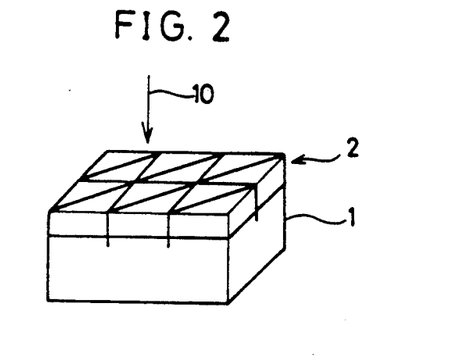

Referring to FIG. 2, cutting plane lines are formed on the polycrystalline diamond layer 2, which is provided on the substrate 1, with a laser beam 10 along a prescribed tool material configuration.

Figure 3:
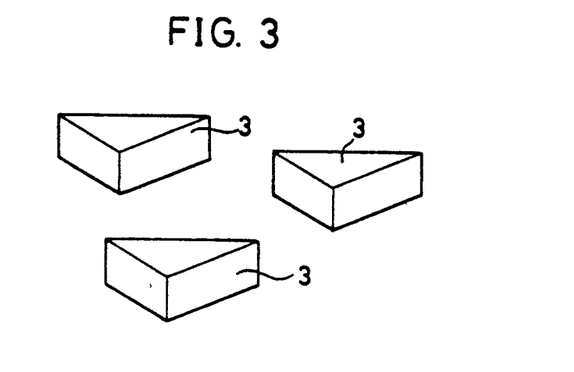
Figure 4:
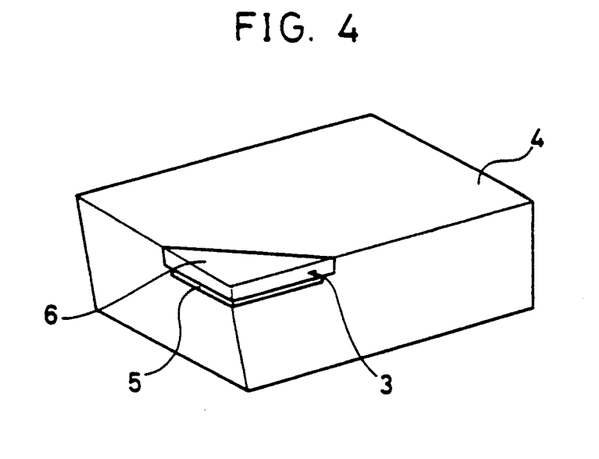

Referring to FIG. 3, chemical processing is performed with hydrochloric acid, sulfuric acid, nitric acid, hydrofluoric acid or a mixed solution thereof, to dissolve the substrate 1 and remove the same from the polycrystalline diamond. Each of the as-formed polycrystalline diamond tool materials 3 is directly subjected to processing for forming a cutting edge if the thickness thereof is in excess of 1 mm in the direction of lamination, and clamped to a holder so that the same can be applied to a tool. If the thickness is in a range of 0.05 to 1 mm, preferrably 0.1 to 1 mm, on the other hand, the tool material 3 can be applied to a cutting tool which is connected with a tool holder of cemented carbide, steel or the like. If a polycrystalline diamond tool material 3 having a thickness smaller than 0.05 mm is applied to a cutting tool which is connected with a tool holder, chipping is easily caused due to insufficient strength of the tool material 3. In such a connection type cutting tool, the thickness of the tool material 3 may sufficiently be about 1 mm for a general use. As shown in FIG. 4, it is requisite that the polycrystalline diamond tool material 3 is connected with the tool holder 4 after the former is brazed to the latter at the portion 5, so that a surface, which has been in contact with the substrate 1, of the tool material 3 defines the cutting face 6.

Figure 5:
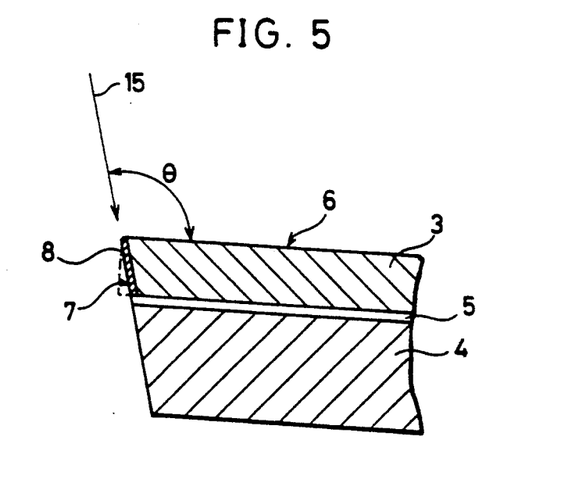

Referring to FIG. 5, laser beam machining is applied to formation of the cutting edge under properly selected conditions, thereby manufacturing a cutting tool having an excellent edge sharpness, which has been hard to attain by grinding. This sharpness is possible because damage is reduced as compared to grinding, which is a mechanical removing method, since the polycrystalline diamond serving as the tool material contains no binder and the laser beam machining is accompanied by a thermal reaction. A YAG laser is preferably employed for the laser beam machining, in consideration of working efficiency and quality. A laser beam 15 is applied from the cutting face 6 side of the tool, or from an opposite side. At this time, an angle $\theta$ between the laser beam 15 and the cutting face 6 is set at a prescribed value so that a predetermined clearance angle can be formed. The tool is inclined with respect to the laser beam 15 and moved, in order to set the angle $\theta$. Alternatively, the laser beam 15 may be adjusted while fixing the tool. The laser processing conditions are so selected that the size of cutting edge chipping is 0.5 to 5 $\mu$m. Preferable the conditions are: average power of 2 to 5 W, a laser repetition rate of 1 to 5 KHz, and a laser beam operation rate of 0.1 to 5 mm/sec.

Figure 7:
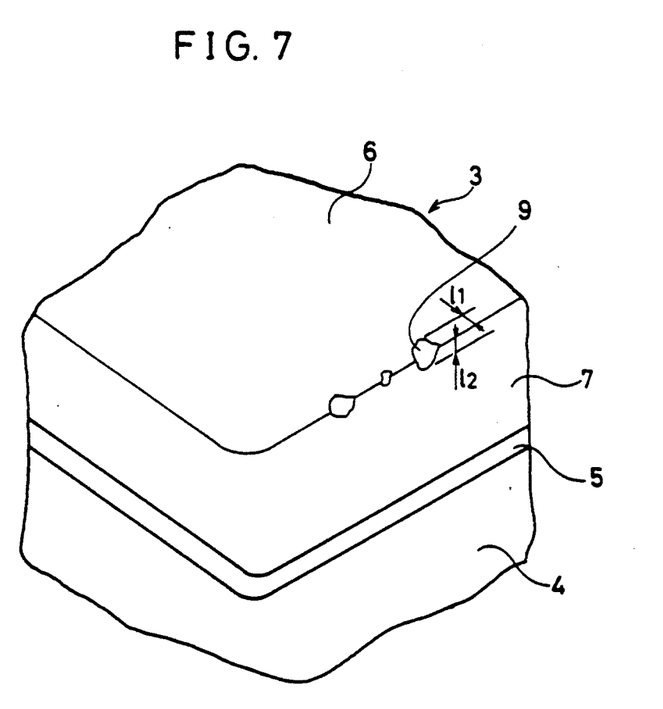
FIG. 7 is an enlarged perspective view showing a cutting edge portion of the polycrystalline diamond cutting tool.

The size of chipping is now defined with reference to FIG. 7. FIG. 7 illustrates the cutting edge portion of the polycrystalline diamond tip shown in FIG. 6 in an enlarged manner, for typically showing a state of chipping 9 caused along the intersection between the rake face 6 and the flank 7. The size of such chipping 9 is defined by a larger value of lengths $l_1$ and $l_2$ measured toward the rake face 6 and toward the flank 7 respectively with reference to the intersection between the rake face 6 and the flank 7. It is possible to further reduce such chipping beyond the lower limit of 0.5 $\mu$m, which has been estimated from the results of experiments made by the inventors, by changing the laser beam processing conditions.

Referring again to FIG. 5, a graphite coating layer 8 is formed on the surface of the flank 7 after the cutting edge is formed by laser processing. The thickness of this graphite coating layer 8 is about 0.5 to 10 $\mu$m.

Experimental Examples of the present invention are now described in detail.

EXPERIMENTAL EXAMPLE 1

Polycrystalline diamond was synthesized for 10 hours on an Si substrate having a mirror surface of 0.05 $\mu$m in surface roughness at the maximum height of irregularities $R_{max}$ by microwave plasma CVD, under the following conditions:

Raw Material Gas (Flow Rate): $H_2$: 200 sccm, $CH_4$: 10 sccm.
Gas Pressure: 120 Torr.
Microwave Oscillation Power: 650 W After the synthesis, the substance was dipped in hydrofluoric-nitric acid to dissolve and remove only the Si substrate, thereby recovering polycrystalline diamond of 5 $\mu$m in mean crystal grain size and 0.2 mm in thickness. The growth plane side of this polycrystalline diamond was connected with a shank of cemented carbide by brazing. Then this connected body was maintained in an inclined state so that a laser beam for processing was at an angle $\theta$ of 101° with respect to a rake face of the connected body to form a cutting edge, thereby manufacturing a throw-away tip (type No. SPGN120304). The cutting edge was formed by a YAG laser of a continuous oscillation mode with laser power of 3 W. The as-formed throw-away tip (hereinafter referred to as "sample A") was examined with a microscope, whereby it was found that the size of chipping was 1 $\mu$m and the flank was covered with a graphite layer of 2 $\mu$m in thickness.

Comparative samples were prepared by employing a tool material of sintered diamond of 5 $\mu$m in grain size containing 12 percent by volume of Co as a binder and forming a cutting edge by laser processing similarly to the above (sample B), forming a cutting edge by grinding with a diamond grindstone of #1500 (sample C), and employing the aforementioned tool material of polycrystalline diamond and forming a cutting edge by grinding similarly to the sample C (sample D). These samples B, C and D exhibited amounts of chipping of 30 $\mu$m, 20 $\mu$m and 15 $\mu$m respectively, which were larger as compared with the sample A.

These throw-away tips, serving as finishing tools, were subjected to performance evaluation tests under the following conditions:

Cutting Conditions

Workpiece: round bar of AC4C-T8 (Al—7%Si)
Cutting Speed: 500 m/min.
Depth of Cut: 0.2 mm
Feed Rate: 0.1 mm/rev.
Coolant: water-soluble oil solution Evaluation Method Comparison of work surface roughness values after cutting for 5 minutes and 60 minutes
Table 1 shows the results.

TABLE 1

| Sample No. | | Roughness of Work Surface | |
|---|---|---|---|
| | | After 5 min. Cutting | After 60 min. Cutting |
| Inventive Sample | A | 1.8 | 1.7 |
| Comparative Sample | B | 5.3 | 6.7 |
| Comparative Sample | C | 3.2 | 3.5 |
| Comparative Sample | D | 2.3 | 2.5 |

It has been clarified from the above results that the inventive tool maintained a sharp cutting edge for a long time, to obtain excellent work surfaces.

EXPERIMENTAL EXAMPLE 2

Polycrystalline diamond was synthesized for 20 hours on Mo substrates having surface roughness of 0.03 $\mu$m at the maximum height of irregularities $R_{max}$ by thermal CVD using a linear tungsten filament of 0.5 mm in diameter and 100 mm in length as a thermoionic emission material under the following conditions:
Raw Material Gas (Flow Rate): $H_2$: 300 sccm, $C_2H_2$: 15 sccm.
Gas Pressure: 80 Torr.
Filament Temperature: 2150° C.
Filament-to-Substrate Distance: 6 mm.
Substrate Temperature: 920°.

After the synthesis, the substances were dipped in heated aqua regia to dissolve and remove only the Mo substrates, thereby recovering polycrystalline diamond members of 3 μm in mean crystal grain size and 0.15 mm in thickness. Surfaces of the polycrystalline diamond members which had been in contact with the substrates were in mirror states of 0.03 μm in surface roughness at the maximum height of irregularities $R_{max}$. The growth plane sides of these polycrystalline diamond members were connected with shanks of cemented carbide by brazing. These connected bodies were maintained in inclined states so that rake face sides thereof were irradiated with a laser beam emitted from a YAG laser which was continuously oscillated with power of 3 W to form cutting edges, thereby manufacturing throw-away tips of different wedge angles. The flanks of the tools were covered with graphite layers of 3 μm in thickness.

Comparative samples were manufactured by employing the aforementioned tool materials of polycrystalline diamond and forming cutting edges by grinding with a of a diamond grindstone of #2000, and employing a tool material of a diamond sintered body of 3 mm in grain size containing 15 percent by volume of Co as a binder and forming cutting edges by similar grinding.

Table 2 shows the amounts of cutting edge chipping of these tools.

TABLE 2

| Tool Material | Working Method | Amount of Cutting Edge Chipping (μm) Wedge Angle (degree) | | | |
|---|---|---|---|---|---|
| | | 90° | 85° | 80° | 75° |
| Inventive Sample | Polycrystalline Diamond | Laser Beam Processing | 1 | 3 | 2 | 3 |
| Comparative Sample | Polycrystalline Diamond | Grinding | 8 | 10 | 8 | 12 |
| Comparative Sample | Sintered Diamond | Grinding | 15 | 18 | 20 | 20 |

It has been clarified from the above results that it is possible to easily manufacture a tool having excellent edge sharpness, which has been hard to manufacture by general grinding.

EXPERIMENTAL EXAMPLE 3

Mixed gas containing $H_2$, $C_2H_6$ and Ar gas in ratios of 8:1:1 was supplied onto a mirror-finished tungsten substrate of 0.06 μm in surface roughness at the maximum height of irregularities $R_{max}$, which was placed in a reaction tube, at a flow rate of 500 sccm, and the pressure was adjusted to 150 Torr. Then, a high-frequency of 13.56 MHz was applied from a high-frequency oscillator to excite the mixed gas for generating plasma, thereby synthesizing polycrystalline diamond for 30 hours. The high-frequency output was selected in a range of 700 to 900 W every synthesizing experiment.

After each synthesizing experiment was terminated, the substrate was treated with heated aqua regia to recover the polycrystalline diamond. Mean crystal grain sizes of the recovered polycrystalline diamond members were varied with the experiments in a range of 5 to 30 μm, while every member exhibited a thickness of 1.6 mm and had a mirror surface of 0.06 μm in surface roughness at the maximum height of irregularities $R_{max}$ on the substrate side. In order to manufacture throw-away tips (type No. TPGN060104-B) from these polycrystalline diamond members, a YAG laser was employed with various power conditions for laser processing. The as-formed throw-away tips were subjected to observation of machined states of the cutting edges, and thereafter subjected to cutting tests under the following conditions, for performance evaluation through measurement of work surface roughness values:

Cutting Conditions

Workpiece: round bar of AC4A-T6 (Al—10%Si)
Cutting Speed: 300 m/min.
Depth of Cut: 0.15 mm
Feed Rate: 0.08 mm/rev.
Cutting Time: 90 min.
Coolant: water-soluble oil solution
Table 3 shows the results.

TABLE 3

| | Tool No. | | | | | | |
|---|---|---|---|---|---|---|---|
| | E | F | G | H | I | J | K |
| Grain Size of Polycrystalline Diamond | 5 | 30 | 12 | 8 | 10 | 15 | 7 |
| Laser Power (W) | 1.0 | 1.5 | 2.5 | 18.5 | 0.2 | 3.0 | 2.0 |
| Amount of Cutting Edge Chipping | 2 | 30 | 4 | 20 | * | 5 | 3 |
| Thickness of Graphite Layer Covering Cutting Edge | 2 | 5 | 7 | 30 | * | 9 | 6 |
| Roughness of Work Surface | 1.2 | 3.5 | 1.5 | 2.8 | * | 1.6 | 1.4 |

*The tool No. I was unmachinable since the laser power was too small.

It is conceivable from the above results that the tools Nos. F and H were remarkably chipped due to an excessive grain size of the polycrystalline diamond and improper laser processing conditions respectively. On the other hand, the tools Nos. E, G, J and K according to the present invention exhibited excellent edge sharpness, and attained excellent surface roughness.

Figure 8:
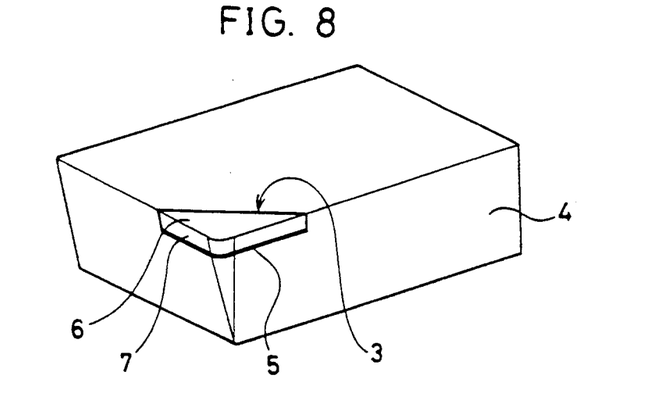
FIG. 8 is a structural diagram showing a polycrystalline diamond cutting tool according to a second embodiment of the present invention.

A second embodiment of the present invention is now described. Referring to FIG. 8 showing a polycrystalline diamond cutting tool according to the second embodiment, a surface of polycrystalline diamond is exposed on the surface of a flank 7 which is formed by laser processing. Namely, after the manufacturing steps of the first embodiment as shown in FIGS. 1 to 5 are carried out, the graphite coating layer 8 formed on the flank 7 etc. is removed by a chemical method of dissolving the same in acid or alkali fused salt for removal. The acid is preferably prepared from dichromic acid, or a mixed solution of sulfuric acid and nitric acid. When a mixed solution of sulfuric acid and nitric acid is employed, it is important to mix the materials in a ratio of 1:9 to 9:1, in order to efficiently dissolve the graphite layer. The alkali fused salt may be prepared form potassium hydroxide, potassium nitrate, sodium hydroxide, sodium nitrate or a mixture thereof. When the polycrystalline diamond cutting tool is connected with a tool holder 4 as shown in FIG. 8, the alkali fused salt is preferably used in the step of removing the graphite coating layer 8. This is because a brazing filler metal employed for connection or the tool holder 4 may be damaged if acid is employed.

The polycrystalline diamond cutting tool manufactured in the aforementioned manner has the rake face 6 which is in a mirror state of not more than 0.1 μm in surface roughness at the maximum height of irregularities $R_{max}$, a flank 7 which is not covered with graphite but exposes polycrystalline diamond, and a cutting edge having excellent edge sharpness with chipping suppressed in a range of 0.5 to 5 μm.

Experimental Examples are now described in detail.

EXPERIMENTAL EXAMPLE 4

Polycrystalline diamond was synthesized for 10 hours on an Si substrate having a mirror surface of not more than 0.05 μm in surface roughness at the maximum height of irregulaties $R_{max}$ by microwave plasma CVD under the following conditions:
Raw Material Gas (Flow Rate): $H_2$: 200 sccm, $CH_4$: 10 sccm.
Gas Pressure: 120 Torr.
Microwave Oscillation Power: 650 W.

After the synthesis, the substance was dipped in hydrofluoric-nitric acid to dissolve and remove only the Si substrate, thereby recovering polycrystalline diamond of 5 μm in mean crystal grain size and 0.2 μm in thickness. A surface of this polycrystalline diamond on the substrate side exhibited surface roughness of 0.05 μm at the maximum height of irregularities $R_{max}$. The growth plane side of this polycrystalline diamond was connected with a shank of cemented carbide by brazing. This connected body was maintained in an inclined state to be irradiated with a laser beam at an angle of 101° with respect to a cutting face thereof for forming a rake edge, thereby manufacturing a throw-away tip No. A (type No. SPGN120304). A YAG laser of a continuous oscillation mode was employed for such formation of the cutting edge with power of 3 W. The as-formed throw-away tip No. A chipping of 1 μm, while its flank was covered with a graphite layer of 2 μm in thickness. Then, another tip was prepared by laser processing under the same conditions as the throw-away tip No. A, and dipped in a mixture of equal volumes of potassium nitrate and sodium nitrate, which was heated to 500° C., for 30 minutes, to dissolve and remove a graphite layer. In the as-recovered tip No. B, a brazing filler metal and a shank were not damaged and the graphite layer was completely removed from the flank, while cutting edge chipping remained 1 μm.

These throw-away tips Nos. A and B, serving as finishing tools, were subjected to performance evaluation tests under the following conditions:

Cutting Conditions

Workpiece: round bar of AC4C-T6 (Al—7%Si)
Cutting Speed: 500 m/min.
Depth of Cut: 0.2 mm
Feed Rate: 0.1 mm/rev.
Coolant: water-soluble oil solution

Evaluation Method

Comparison of work surface roughness values after cutting for 5 minutes and 60 minutes As the result, it has been clarified that the inventive tip No. B maintained a sharp cutting edge for a longer time as compared with the comparative tip No. A, and attained excellent work surfaces, as shown in Table 4.

TABLE 4

| Tool No. | Roughness of Work Surface | |
|---|---|---|
| | After 5 min. Cutting | After 60 min. Cutting |
| Comparative Sample A | 1.6 | 1.7 |
| Inventive Sample B | 1.2 | 1.2 |

EXPERIMENTAL EXAMPLE 5

Polycrystalline diamond was synthesized for 20 hours on an Mo substrate having surface roughness of 0.03 μm at the maximum height of irregularities $R_{max}$ by thermal CVD employing a linear tungsten filament of 0.05 mm in diameter and 100 mm in length as a thermoionic emission material under the following conditions:
Raw Material Gas (Flow Rate): $H_2$: 300 sccm, $C_2H_6$: 15 sccm.
Gas Pressure: 80 Torr.
Filament Temperature: 2150° C.
Filament-to-Substrate Distance: 6 mm.
Substrate Temperature: 920° C.

After the synthesis, the substance was dipped in heated aqua regia to dissolve and remove only the Mo substrate, thereby recovering polycrystalline diamond of 3 μm in mean crystal grain size and 0.15 mm in thickness. This polycrystalline diamond has a mirror surface of 0.03 μm in surface roughness at the maximum height of irregularities $R_{max}$ on the substrate side. The growth plane side of this polycrystalline diamond was connected with a shank of cemented carbide by brazing. Then, this connected body was maintained in an inclined state, so that its cutting face was irradiated with a laser beam emitted from a YAG laser which was continuously oscillated with power of 3 W to form a cutting edge, thereby manufacturing a throw-away tip No. C having a wedge angle of 80°. The as-formed tip No. C exhibited chipping of 2 μm, while its flank was covered with a graphite layer of 3 μm in thickness.

Then, another tip No. D of the same type as the above was dipped in a mixture containing potassium nitrate and sodium hydroxide in a ratio of 2:1 in volume, which was heated to 500° C., for 3 minutes, to dissolve and remove the graphite layer. A brazing filler metal and a shank of the as-recovered tip No. D were not damaged, while cutting edge chipping was 2 μm and the graphite layer was completely removed from a flank.

These throw-away tips, serving as finishing tools, were subjected to performance evaluation tests under the following conditions:

Cutting Conditions

Workpiece: round bar of AC8A-T6 (Al—12%Si)
Cutting Speed: 600 m/min.
Depth of Cut: 0.3 mm.
Feed Rate: 0.08 mm/rev.
Coolant: water-soluble oil solution

Evaluation Method

Comparison of amounts of cutting edge wear (chipping sizes) after cutting for 5 minutes and 60 minutes Table 5 shows the results of the performance evaluation tests.

TABLE 5

| Tool No. | Removal of Graphite Layer | Item of Evaluation | Result After 5 mn. Cutting | After 60 min. Cutting |
| --- | --- | --- | --- | --- |
| Comparative C | No | Cutting Edge Chipping | 20 μm | 25 μm |
| | | Roughness of Work Surface | 1.8 μm | 2.1 μm |
| Inventive Sample D | Yes | Cutting Edge Chipping | 5 μm | 6 μm |
| | | Roughness of Work Surface | 1.1 μm | 1.2 μm |

It is estimated that the comparative tip No. C was initially chipped by influence of remarkable workpiece welding to the cutting edge in an initial cutting stage, dissimilarly to the inventive tip No. D. On the other hand, substantially no workpiece welding to the cutting edge was caused in the inventive tip No. D since its flank was covered with no graphite layer. Thus, it has been clarified that a sharp cutting edge was maintained for a long time in the inventive tip No. D.

EXPERIMENTAL EXAMPLE 6

Mixed gas containing $H_2$, $C_2H_6$ and Ar in ratios of 8:1:1 was supplied onto a mirror-finished tungsten substrate of 0.06 μm in surface roughness at the maximum height of irregularities $R_{max}$, which was placed in a reaction tube, with a flow rate of 500 sccm, and the pressure was adjusted to 150 Torr. Then, a high frequency of 13.56 MHz was applied from a high frequency oscillator to excite the mixed gas for generating plasma, thereby synthesizing polycrystalline diamond for 30 hours. The output of the high frequency was selected in a range of 700 to 900 W every synthesizing experiment.

After each synthesizing experiment, the substrate was treated with heated aqua regia, to recover the polycrystalline diamond. The as-recovered polycrystalline diamond members exhibited mean crystal grain sizes of 5 to 30 μm, which were varied with the experiments, while all samples had thicknesses of 1.6 mm and mirror surface of 0.06 μm in surface roughness at the maximum height of irregularities $R_{max}$ on the substrate sides. Throw-away tips Nos. E, F and G (type No. TPGN060104-B) were prepared from these polycrystalline diamond members, using a YAG laser under various power conditions. Further, tips Nos. H, I and J were prepared under the same conditions as the aforementioned throw-away tips Nos. E, F and G, and dipped in dichromic acid, which was heated to 100° C., to remove graphite layers from flanks thereof. As to these tips Nos. H, I and J and the aforementioned tips Nos. E, F and G, which were not subjected to acid treatment, states of cutting edges were observed. Thereafter cutting experiments were made under the following conditions for performance evaluation with measurement of work surface roughness values.

Cutting Conditions

Workpiece: round bar of AC4A-T6 (Al—10%Si)
Cutting Speed: 300 m/min.
Depth of Cut: 0.15 mm
Feed Rate: 0.08 mm/rev.
Cutting Time: 90 min.
Coolant: water-soluble oil solution Table 6 shows the results of the performance evaluation tests.

TABLE 6

| | Tool No. | | | | | |
| --- | --- | --- | --- | --- | --- | --- |
| | E | F | G | H | I | J |
| Grain Size of Polycrystalline Diamond (μm) | 5 | 30 | 12 | 5 | 30 | 12 |
| Laser Power (W) | 1.0 | 1.5 | 2.5 | 1.0 | 1.5 | 2.5 |
| Amount of Cutting Edge Chipping (μm) | 2 | 30 | 4 | 2 | 30 | 4 |
| Thickness of Graphite Layer Covering Cutting Edge | 2 | 5 | 7 | 0 | 0 | 0 |
| Roughness of Work Surface | 1.2 | 3.5 | 1.5 | 0.8 | 3.2 | 1.0 |

Referring to Table 6, it is conceivable that the tips Nos. F and I caused remarkable chipping and could not attain excellent work surfaces since the polycrystalline diamond members had excessive grain sizes. On the other hand, it has been clarified that both of the inventive tips Nos. H and J exhibited excellent edge sharpness and attained excellent surface roughness as compared with the comparative tips Nos. E and G since flanks thereof were covered with no graphite layers.

Figure 9:
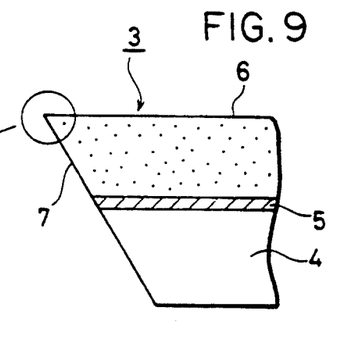
FIGS. 9 and 9A show a structural diagram showing a polycrystalline diamond cutting tool according to a third embodiment of the present invention.
Figure 9A:
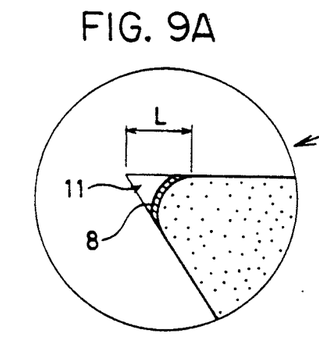

A third embodiment of the present invention is now described. Referring to FIG. 9, a polycrystalline diamond tip 3 is strongly attached to a tool holder 4 of cemented carbide or steel through a brazing portion 5. The upper surface of the polycrystalline diamond tip 3 forms a tool rake face 6, while a flank 7 is formed at a prescribed angle with respect to the rake face 6. A cutting edge portion 11 is formed along the intersection between the rake face 6 and the flank 7. The cutting edge portion 11 is formed on a honed curved surface which has prescribed curvature, while its surface is covered with a graphite coating layer 8, which has been formed during honing. The amount of honing as mentioned in claims is now defined. Referring to FIG. 9 showing the cutting edge portion 11 in an enlarged manner, the amount of honing is shown by a length L between the intersection point of extension lines of the tool rake face 6 and the flank 7 and an end portion of the rake face 6 or the flank 7. This amount L of honing is preferably in a range of 5 to 20 μm, since no improvement of initial chipping resistance is attained if the amount L is less than 5 μm, while the cutting edge is damaged and roughness of the finished surface is reduced if the amount L exceeds 20 μm.

Manufacturing steps are now described. The steps of the first embodiment as shown in FIGS. 1 to 4 are similarly employed for manufacturing the polycrystalline diamond cutting tool according to the third embodiment.

Figure 10:
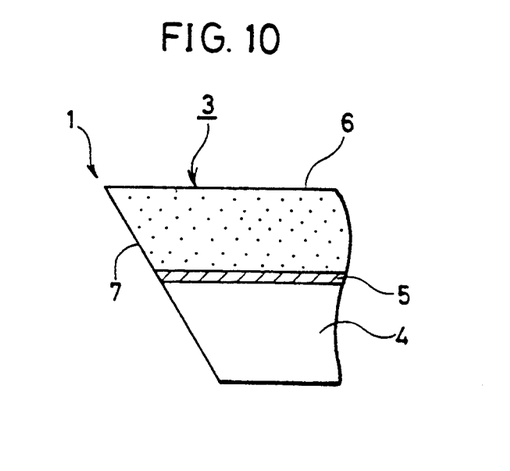
FIG. 10 is a sectional structural diagram showing an important step of manufacturing the polycrystalline diamond cutting tool shown in FIG. 9.

Referring to FIG. 10, a flank 7 is formed with a fine-grain diamond grindstone or the like, at a prescribed angle with respect to a cutting face 6. Thereafter a cutting edge portion is honed with a laser beam. Since the laser beam machining is accompanied with thermal reaction, the cutting edge portion is less damaged as compared with a case of grinding, which is a mechanical removing method. The cutting edge portion 11 is covered with a graphite coating layer 8 by this laser beam machining. This graphite coating layer 8 is preferably 0.5 to 10 μm thick. It is difficult to form the graphite coating layer 8 in a thickness of not more than 0.5 μm for the time being, while the cutting edge portion 11 is remarkably damaged and chipping resistance is reduced if the thickness of the graphite coating layer 8 exceeds 10 μm.

EXPERIMENTAL EXAMPLE 7

Polycrystalline diamond was synthesized for 10 hours on an Si substrate having a mirror surface of 0.05 μm in surface roughness at the maximum height of irregularities $R_{max}$ by microwave plasma CVD, under the following conditions:

Raw material Gas (Flow Rate): $H_2$: 200 sccm, $CH_4$: 10 sccm.
Gas Pressure: 120 Torr.
Microwave Oscillation Power: 650 W.

After the synthesis, the substance was dipped in hydrofluoric-nitric acid to dissolve and remove only the Si substrate, thereby recovering polycrystalline diamond of 5 μm in mean crystal grain size and 0.2 mm in thickness. The surface of the polycrystalline diamond was 0.05 μm in surface roughness at the maximum height $R_{max}$ on the substrate side. The growth plane side of this polycrystalline diamond was connected with a shank of cemented carbide by brazing. Then, this connected body was ground with a diamond grindstone of #1500, to prepare a throw-away tip No. A (type No. SPGN120304). The as-formed throw-away tip No. A exhibited cutting edge chipping of 10 μm.

Another throw-away tip No. B was prepared in the same method as the above, and its cutting edge was honed with a YAG laser in an amount L of honing of 10 μm. A graphite coating layer of 3 μm in thickness was formed on the honed portion of the as-formed throw-away tip No. B following the laser beam machining, while the size of cutting edge chipping was 2 μm.

10 samples each of these throw-away tips Nos. A and B were prepared and subjected to performance evaluation tests under the following conditions: Cutting Conditions Workpiece: round bar of A390-T6 (Al—17%Si) axially provided with four V-shaped grooves
Cutting Speed: 500 m/min.
Depth of Cut: 0.2 mm.
Feed Rate: 0.1 mm/rev.
Coolant: water-soluble oil solution.

As the result, 5 samples, 3 samples and 2 samples of the throw-away tip No. A were chipped in 5 minutes, 8 minutes and 20 minutes respectively after cutting. On the other hand, all samples of the inventive tip No. B caused no chipping in cutting edges after cutting for 60 minutes, and attained excellent work surfaces. It has been clarified from these results that the inventive tip serves as a cutting tool which has high toughness.

Thus, it is possible to obtain a polycrystalline diamond cutting tool having excellent chipping resistance and high toughness by honing its cutting edge portion by laser beam machining.

Although the present invention has been described and illustrate in detail, it is clearly understood that the same is by way of illustration and example only and is not to be taken by way of limitation, the spirit and scope of the present invention being limited only by the terms of the appended claims.

What is claimed is:

1. A polycrystalline diamond cutting tool prepared from a tool material of a polycrystalline diamond layer being synthesized on a base material by a low-pressure vapor phase method, said polycrystalline diamond cutting tool comprising:

a rake face having surface roughness of not more than 0.2 μm at the maximum height of irregularities ($R_{max}$); and a flank provided with a graphite coating layer on its surface.

2. Polycrystalline diamond cutting tool in accordance with claim 1, wherein the thickness of said polycrystalline diamond layer is at least 0.05 mm and not more than 1 mm.

3. A polycrystalline diamond cutting tool in accordance with claim 1, wherein the size of cutting edge chipping along the intersection between said rake face and said flank is at least 0.5 μm and not more than 5 μm.

4. A polycrystalline diamond cutting tool in accordance with claim 1, wherein the thickness of said graphite coating layer provided on said flank is at least 0.5 μm and not more than 10 μm.

5. A polycrystalline diamond cutting tool in accordance with claim 1, wherein the crystal grain size of said polycrystalline diamond is at least 0.5 μm and not more than 15 μm.

6. A polycrystalline diamond cutting tool in accordance with claim 1, wherein said rake face utilizes a surface having been in contact with said base material formed of one of metal and alloy.

7. A polycrystalline diamond cutting tool prepared by employing a polycrystalline diamond layer being synthesized on a base material by a low-pressure vapor phase method as a tool material and connecting said tool material with a tool holder, said polycrystalline diamond cutting tool comprising:

a rake face having surface roughness of not more than 0.2 μm at the maximum height of irregularities ($R_{max}$); and a flank provided with a graphite coating layer on its surface.

8. A polycrystalline diamond cutting tool in accordance with claim 7, wherein the thickness of said polycrystalline diamond layer is at least 0.05 mm and not more than 1 mm in a direction substantially perpendicular to said rake face.

9. A polycrystalline diamond cutting tool in accordance with claim 7, wherein the size of cutting edge chipping along the intersection between said rake face and said flank is at least 0.5 μm and not more than 5 μm.

10. A polycrystalline diamond cutting tool in accordance with claim 7, wherein the thickness of said graphite coating layer provided on said flank is at least 0.5 μm and not more than 10 μm.

11. A polycrystalline diamond cutting tool in accordance with claim 7, wherein the mean grain size of said polycrystalline diamond is at least 0.5 μm and not more than 15 μm.

12. A polycrystalline diamond cutting tool in accordance with claim 7, wherein said rake face utilizes a surface having been in contact with said base material formed of one of metal and alloy.

13. A polycrystalline diamond cutting tool prepared from a polycrystalline diamond layer being synthesized on a base material by a low-pressure vapor phase method, said polycrystalline diamond cutting tool comprising:

a rake face having surface roughness of not more than 0.2 μm at the maximum height of irregularities ($R_{max}$); and a flank exposing a surface of said polycrystalline diamond having a graphite coating thereon.

the size of cutting edge chipping along the intersection between said rake face and said flank being at least 0.5 μm and not more than 5 μm.

14. A polycrystalline diamond cutting tool in accordance with claim 13, wherein the mean grain size of said polycrystalline diamond forming said polycrystalline diamond cutting tool is at least 0.5 μm and not more than 15 μm.

15. A polycrystalline diamond cutting tool in accordance with claim 13, wherein the thickness of said polycrystalline diamond forming said polycrystalline diamond cutting tool is at least 0.05 mm and not more than 1 mm in a direction substantially perpendicular to said rake face.

16. A polycrystalline diamond cutting tool in accordance with claim 13, wherein said rake face utilizes a surface having been in contact with said base material formed of one of metal and alloy.

17. A polycrystalline diamond cutting tool prepared by employing a polycrystalline diamond layer being synthesized on a base material by a low-pressure vapor phase method as a tool material and connecting said tool material with a tool holder, said polycrystalline diamond cutting tool comprising:
a rake face having surface roughness of not more than 0.2 μm at the maximum height of irregularities ($R_{max}$); and
a flank exposing a surface of said polycrystalline diamond having a graphite coating thereon.
the size of cutting edge chipping along the intersection between said rake face and said flank being at least 0.5 μm and not more than 5 μm.

18. A polycrystalline diamond cutting tool in accordance with claim 17, wherein the mean grain size of said polycrystalline diamond forming said tool material is at least 0.5 μm and not more than 15 μm.

19. A polycrystalline diamond cutting tool in accordance with claim 17, wherein the thickness of said polycrystalline diamond forming said tool material is at least 0.05 mm and not more than 1 mm in a direction substantially perpendicular to said cutting face.

20. A polycrystalline diamond cutting tool in accordance with claim 17, wherein said rake face utilizes a surface having been in contact with said base material formed of one of metal and alloy.

21. A polycrystalline diamond cutting tool prepared from a polycrystalline diamond layer being synthesized by a low-pressure vapor phase method, comprising;
a cutting edge portion formed along an intersection between a cutting face and a flank of said diamond cutting tool, said cutting edge portion having a honed curved surface.

22. A polycrystalline diamond cutting tool in accordance with claim 21, wherein the amount of honing of said cutting edge portion is at least 5 μm and not more than 20 μm.

23. A polycrystalline diamond cutting tool in accordance with claim 21, wherein said honed cutting edge portion is covered with a graphite layer of at least 0.5 μm and not more than 10 μm in thickness.

24. A polycrystalline diamond cutting tool in accordance with claim 21, wherein the mean grain size of said polycrystalline diamond is at least 0.5 μm and not more than 10 μm.

25. A polycrystalline diamond cutting tool prepared by employing a polycrystalline diamond layer being synthesized by a low-pressure vapor phase method as a tool material and connecting said tool material with a tool holder, said polycrystalline diamond cutting tool comprising a cutting edge portion, being formed along the intersection between a cutting face and a flank of said tool having a honed curved surface.

26. A polycrystalline diamond cutting tool in accordance with claim 25, wherein the amount of honing of said cutting edge portion is at least 5 μm and not more than 20 μm.

27. A polycrystalline diamond cutting tool in accordance with claim 25, wherein said honed cutting edge portion is covered with a graphite layer of at least 0.5 μm and not more than 10 μm in thickness.

28. A polycrystalline diamond cutting tool in accordance with claim 25, wherein the mean grain size of said polycrystalline diamond is at least 0.5 μm and not more than 10 μm.

29. The method of manufacturing a polycrystalline diamond cutting tool, comprising the steps of:
depositing a polycrystalline diamond layer on a surface of a base material formed of one of metal and alloy having surface roughness of not more than 0.2 μm at the maximum height of irregularity ($R_{max}$) by a low-pressure vapor phase method;
cutting said coated polycrystalline diamond layer being deposited on said base material, into a prescribed tip configuration and thereafter removing said base material from said polycrystalline diamond tip by chemical processing; and
performing laser processing on a surface of said polycrystalline diamond tip intersecting with rake surface having been in contact with said base material, thereby forming a flank with depositing a graphite coating thereon.

30. A method of manufacturing a polycrystalline diamond cutting tool in accordance with claim 29, wherein said polycrystalline diamond layer is deposited in a thickness of at least 0.05 mm and not more than 1 mm.

31. A method of manufacturing a polycrystalline diamond cutting tool in accordance with claim 29, wherein said base material is prepared from any one of Mo, W and Si.

32. A method of manufacturing a polycrystalline diamond cutting tool in accordance with claim 29, wherein said base material is removed from said polycrystalline diamond by chemical processing with any one of hydrochloric acid, sulfuric acid, nitric acid, hydrofluoric acid and a mixed solution thereof.

33. A method of manufacturing a polycrystalline diamond cutting tool in accordance with claim 29, wherein said processing machining for forming said flank is performed under conditions being so selected that the size of cutting edge chipping is at least 0.5 μm and not more than 5 μm.

34. A method of manufacturing a polycrystalline diamond cutting tool in accordance with claim 29, wherein said laser processing is performed under conditions being so selected that the thickness of a graphite coating layer formed on said flank is at least 0.5 μm and not more than 10 μm.

35. A method of manufacturing a polycrystalline diamond cutting tool in accordance with claim 29, wherein said polycrystalline diamond is so formed that its crystal mean grain size is at least 0.5 μm and not more than 15 μm.

36. The method of manufacturing a polycrystalline diamond cutting tool, comprising the steps of:
depositing a polycrystalline diamond layer on a surface of a base material formed of one of metal and alloy having surface roughness of not more than 0.1 μm at the maximum height of irregularities ($R_{max}$) by a low-pressure vapor phase method;

cutting said polycrystalline diamond, being deposited on said base material, into a prescribed tip configuration and thereafter removing said base material from said polycrystalline diamond tip by chemical processing;

connecting said polycrystalline diamond tip with a tool holder so that a surface, having been in contact with said base material, of said polycrystalline diamond tip defines a tool rake face; and performing laser processing on a surface, intersecting with said rake face, of said polycrystalline, diamond tip for forming a flank; and depositing a graphite coating onto said flank.

37. A method of manufacturing a polycrystalline diamond cutting tool in accordance with claim 36, wherein either cemented carbide or steel is employed as a material for said tool holder.

38. The method of manufacturing a polycrystalline diamond cutting tool, comprising the steps of:

depositing a polycrystalline diamond layer on a surface of a base material formed of one of metal and alloy having surface roughness of not more than 0.1 μm at the maximum height of irregularities ($R_{max}$) by a low-pressure vapor phase method;

cutting said polycrystalline diamond, being deposited on said base material, into a prescribed tip configuration and thereafter removing said base material from said polycrystalline diamond tip;

performing laser processing on a surface of said polycrystalline diamond tip intersecting with rake surface having been in contact with, said base material for forming a flank with deposition a coating of graphite thereon; and removing a graphite coating layer formed on said flank by said laser processing.

39. A method of manufacturing a polycrystalline diamond cutting tool in accordance with claim 38, wherein said graphite coating layer is removed by a chemical method.

40. A method of manufacturing a polycrystalline diamond cutting tool in accordance with claim 38, wherein said graphite coating layer is dissolved and removed either by an acid solution or by an alkali fused salt.

41. The method of manufacturing a polycrystalline diamond cutting tool, comprising the steps of:

depositing a polycrystalline diamond on a surface of a base material formed of one of metal and alloy having surface roughness of not more than 0.2 μm at the maximum height of irregularities ($R_{max}$) by a low-pressure vapor phase method;

cutting said polycrystalline diamond layer, being deposited on said base material, into a prescribed tip configuration and thereafter removing said base material from said polycrystalline diamond tip by chemical processing;

connecting said polycrystalline diamond tip with a tool holder so that a surface, having been in contact with said base material, of said polycrystalline diamond tip defines a tool rake face;

performing laser processing on another surface, intersecting with said rake face, of said polycrystalline diamond tip for forming a flank with depositing a coating of graphite thereon; and removing a graphite coating layer formed on said flank by said laser processing.

42. A method of manufacturing a polycrystalline diamond cutting tool in accordance with claim 41, wherein said graphite coating layer is removed by a chemical method.

43. A method of manufacturing a polycrystalline diamond cutting tool in accordance with claim 41, wherein said graphite coating layer is removed either by an alkali fused salt or by an acid solution.

44. The method of manufacturing a polycrystalline diamond cutting tool, comprising the steps of:

depositing a polycrystalline diamond layer on a surface of a base material by a low-pressure vapor phase method;

cutting said polycrystalline diamond, being deposited on said base material, into a prescribed tip configuration and thereafter removing said base material from said polycrystalline diamond tip by chemical processing;

defining a tool rake face by a surface, having been in contact with said base material, of said polycrystalline diamond tip and forming a flank with depositing a coating of graphite thereon at a prescribed angle with respect to said rake face, thereby forming a cutting edge portion; and honing said cutting edge portion for forming a curved surface.

45. A method of manufacturing a polycrystalline diamond cutting tool in accordance with claim 44, wherein said cutting edge portion is honed with a laser beam.

* * * * *